United States Patent
Sugisawa et al.

(10) Patent No.: US 9,531,261 B2
(45) Date of Patent: Dec. 27, 2016

(54) POWER SUPPLY CONTROL DEVICE

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Yuuki Sugisawa, Yokkaichi (JP); Katsuya Ikuta, Yokkaichi (JP); Masahiko Furuichi, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 15/025,829

(22) PCT Filed: Sep. 29, 2014

(86) PCT No.: PCT/JP2014/075781
§ 371 (c)(1),
(2) Date: Mar. 29, 2016

(87) PCT Pub. No.: WO2015/053105
PCT Pub. Date: Apr. 16, 2015

(65) Prior Publication Data
US 2016/0248320 A1    Aug. 25, 2016

(30) Foreign Application Priority Data

Oct. 10, 2013 (JP) .................................. 2013-213205
Feb. 3, 2014 (JP) .................................. 2014-018498

(51) Int. Cl.
*H03B 1/00* (2006.01)
*H03K 3/00* (2006.01)
(Continued)

(52) U.S. Cl.
CPC ................. *H02M 3/07* (2013.01); *G05F 3/262* (2013.01); *H03K 17/06* (2013.01); *H03K 17/145* (2013.01); *H03K 2217/0063* (2013.01)

(58) Field of Classification Search
CPC .............. H03K 17/063; H03K 17/0822; H03K 17/04123; H03K 2217/0036; H03K 17/687; H03K 19/00361; H03K 19/00315; H03K 19/00384; H04L 25/028; H04L 25/0272
(Continued)

(56) References Cited

U.S. PATENT DOCUMENTS 8,058,700 B1    11/2011  Sullivan
2001/0030532 A1  10/2001  Nagata et al.
(Continued)

FOREIGN PATENT DOCUMENTS

JP    2001-308688 A    11/2001
JP    2007-201728 A    8/2007
JP    2012-507964 A    3/2012

OTHER PUBLICATIONS

Aug. 19, 2016 Search Report issued in European Patent Application No. 14852260.0.
(Continued)

*Primary Examiner* — Quan Tra
(74) *Attorney, Agent, or Firm* — Oliff PLC

(57) ABSTRACT

A power-supply control device that includes a transistor that is interposed between a power source and a load; a control circuit to which a voltage from the power source is applied, the voltage being applied across a high-voltage side input
(Continued)

terminal and a low-voltage side input terminal of the control circuit, and that is configured to turn the transistor on or off based on an operating signal for the load that is applied from an external device, and controlling supply of power to the load; a voltage detector that is configured to detect a value of the voltage applied to the control circuit by the power source, and is configured to determine whether or not the applied voltage value detected is lower than a predetermined voltage value; and a negative voltage output circuit.

8 Claims, 14 Drawing Sheets

(51) Int. Cl.
  *H02M 3/07* (2006.01)
  *H03K 17/06* (2006.01)
  *H03K 17/14* (2006.01)
  *G05F 3/26* (2006.01)
(58) Field of Classification Search
  USPC .............................. 327/108, 109, 427, 434
  See application file for complete search history.

(56) References Cited

U.S. PATENT DOCUMENTS

| | | | |
|---|---|---|---|
| 2011/0057633 A1* | 3/2011 | Tanabe | H02M 3/07 323/265 |
| 2011/0101935 A1* | 5/2011 | Nakahara | H03K 17/063 323/276 |
| 2012/0206125 A1* | 8/2012 | Apriletti | H02M 3/155 323/351 |
| 2013/0214822 A1 | 8/2013 | Sakata et al. | |
| 2013/0222042 A1* | 8/2013 | Kikuchi | H03K 17/04123 327/374 |

OTHER PUBLICATIONS

Dec. 22, 2014 Search Report issued in International Patent Application No. PCT/JP2014/075781.

* cited by examiner

POWER SUPPLY CONTROL DEVICE

BACKGROUND

The present disclosure relates to a power-supply control device, the power-supply control device including a transistor that is interposed between a power source and a load as well as a control circuit to which a voltage from the power source is applied and which turns the transistor on or off based on an operating signal for the load that is applied from an external device, and controlling supply of power to the load.

Power-supply control devices that are installed in vehicles and the like and that supply/interrupt power to loads use electromagnetic relays, semiconductor relays, or the like. MOSFETs (metal oxide semiconductor field-effect transistors) that are used as semiconductor relays have high operating-voltage threshold values and may stop operating when the power source voltage is low. Thus, electromagnetic relays that are capable of operating even at a low voltage are used for loads that need the power supply even when the power source voltage is low.

JP 2012-507964T discloses a driver circuit that supplies a load voltage for feeding electricity to a load. The driver circuit includes a feed voltage source for supplying a feed voltage and a temporal storage unit for temporarily storing electrical energy, and the temporal storage unit is connected to the feed voltage source for supplying the electrical energy. Furthermore, it includes a driver unit to which the electrical energy can be supplied by way of the temporal storage unit as necessary, whereby the load voltage can be supplied to the load in the event of a voltage drop of the feed voltage.

SUMMARY

As in the case of the above-described power-supply control devices, if the power source voltage is low, there are cases where the use of an electromagnetic relay to supply/interrupt the power to a load cannot be avoided. However, the use of an electromagnetic relay disadvantageously increases heat generation and loss when compared with the case where a semiconductor relay is used.

The present disclosure was made in view of circumstances such as those described above, and the present disclosure according to an exemplary aspect provides a power-supply control device that uses a semiconductor relay (IPD (Intelligent Power Device)) with self-protection functionality, which reduces heat generation and loss when compared with an electromagnetic relay, and that is operable even at a power source voltage equal to or below the operating voltage of the IPD.

A power-supply control device according to a first aspect of the disclosure is a power-supply control device that includes a transistor that is interposed between a power source and a load; a control circuit to which a voltage from the power source is applied, the voltage being applied across a high-voltage side input terminal and a low-voltage side input terminal of the control circuit, and that is configured to turn the transistor on or off based on an operating signal for the load that is applied from an external device, and controlling supply of power to the load; a voltage detector that is configured to detect a value of the voltage applied to the control circuit by the power source, and is configured to determine whether or not the applied voltage value detected is lower than a predetermined voltage value; and a negative voltage output circuit that is configured to output a negative voltage to the low-voltage side input terminal of the control circuit if the voltage detector determines that the applied voltage value is lower than the predetermined voltage value.

According to this power-supply control device, the transistor is interposed between the power source and the load. The control circuit, to which the voltage from the power source is applied, the voltage being applied across the high-voltage side input terminal and the low-voltage side input terminal, turns the transistor on or off based on the operating signal for the load applied from an external device, thereby controlling supply of power to the load. The voltage detector detects the value of the voltage applied to the control circuit by the power source. The voltage detector determines whether or not the applied voltage value detected by the voltage detector is lower than the predetermined voltage value. If the voltage detector determines that the applied voltage value is lower than the predetermined voltage value, the negative voltage output circuit outputs a negative voltage to the low-voltage side input terminal of the control circuit.

A power-supply control device according to a second aspect of the disclosure, wherein the negative voltage output circuit includes a first diode whose anode is connected to the power source, an inverting charge pump circuit which is connected to a cathode of the first diode and to which a power source voltage is applied, and a second diode whose cathode is connected to a fixed potential terminal of a capacitor on an output side of the inverting charge pump circuit and whose anode is connected to the low-voltage side input terminal and another terminal of the output-side capacitor, the inverting charge pump circuit being configured to operate if the voltage detector determines that the applied voltage value is lower than the predetermined voltage value.

According to this power-supply control device, in the negative voltage output circuit, the inverting charge pump circuit is connected to the cathode of the first diode whose anode is connected to the power source, and the power source voltage is applied to the inverting charge pump circuit. The cathode of the second diode is connected to the fixed potential terminal of the output-side capacitor of the inverting charge pump circuit, and the anode of the second diode is connected to the low-voltage side input terminal of the control circuit and the other terminal of the output-side capacitor. If the voltage detector determines that the applied voltage value is lower than the predetermined voltage value, the inverting charge pump circuit operates.

A power-supply control device according to a third aspect of the disclosure, wherein the negative voltage output circuit includes a first diode whose anode is connected to the power source, an inverting charge pump circuit which is connected to a cathode of the first diode and to which a power source voltage is applied, and a second diode and a third diode whose cathodes are respectively connected to terminals of a capacitor on an output side of the inverting charge pump circuit and whose anodes are connected to the low-voltage side input terminal, the inverting charge pump circuit being configured to operate if the voltage detector determines that the applied voltage value is lower than the predetermined voltage value.

According to this power-supply control device, in the negative voltage output circuit, the anode of the first diode is connected to the power source, the inverting charge pump circuit is connected to the cathode of the first diode, and the power source voltage is applied to the inverting charge pump circuit. The cathodes of the second diode and the third diode are respectively connected to the terminals of the output-side capacitor of the inverting charge pump circuit, and the anodes of these two diodes are connected to the low-voltage side input terminal of the control circuit. If the voltage detector determines that the applied voltage value is lower than the predetermined voltage value, the inverting charge pump circuit operates.

A power-supply control device according to a fourth aspect of the disclosure, wherein the negative voltage output circuit includes a first diode whose anode is connected to the power source, a switching element that is connected to a cathode of the first diode at one terminal, a coil that is connected between the other terminal of the switching element and a fixed potential terminal, a second diode and a third diode whose cathodes are respectively connected to terminals of the coil and whose anodes are connected to the low-voltage side input terminal, and a second control circuit that performs on/off control of the switching element if the voltage detector determines that the applied voltage value is lower than the predetermined voltage value.

According to this power-supply control device, in the negative voltage output circuit, one of the terminals of the switching element is connected to the cathode of the first diode whose anode is connected to the power source. The coil is connected between the other terminal of the switching element and the fixed potential terminal. The cathodes of the second diode and the third diode, whose anodes are connected to the low-voltage side input terminal of the control circuit, are respectively connected to the terminals of the coil. If the voltage detector determines that the applied voltage value is lower than the predetermined voltage value, the second control circuit performs on/off control of the switching element, thereby causing the coil to output a negative voltage.

A power-supply control device according to a fifth aspect of the disclosure, wherein the control circuit has a shunt circuit that diverts a current that is proportional to a current flowing through the transistor, and the power-supply control device further includes a current mirror circuit to which the current diverted by the shunt circuit is input and which outputs a current related to the input current, a resistor through which the current output by the current mirror circuit flows, and a controller that is configured to determine whether or not to interrupt the current flowing through the transistor based on a voltage related to a voltage across the resistor.

According to this power-supply control device, the shunt circuit of the control circuit diverts the current that is proportional to the current flowing through the transistor, the current diverted by the shunt circuit is input to the current mirror circuit, and the current mirror circuit outputs a current related to the input current. The current output by the current mirror circuit flows through the resistor, and the controller determines whether or not to interrupt the current flowing through the transistor based on a voltage related to the voltage across the resistor.

According to the power-supply control device of the present disclosure, it is possible to realize a power-supply control device that uses a semiconductor relay (IPD) with self-protection functionality, which reduces heat generation and loss when compared with an electromagnetic relay, and that is operable even at a power source voltage equal to or below the operating voltage of the IPD.

DETAILED DESCRIPTION OF EMBODIMENTS

Hereinafter, the present disclosure will be described based on the drawings illustrating embodiments of the present disclosure.

Embodiment 1

Figure 1:
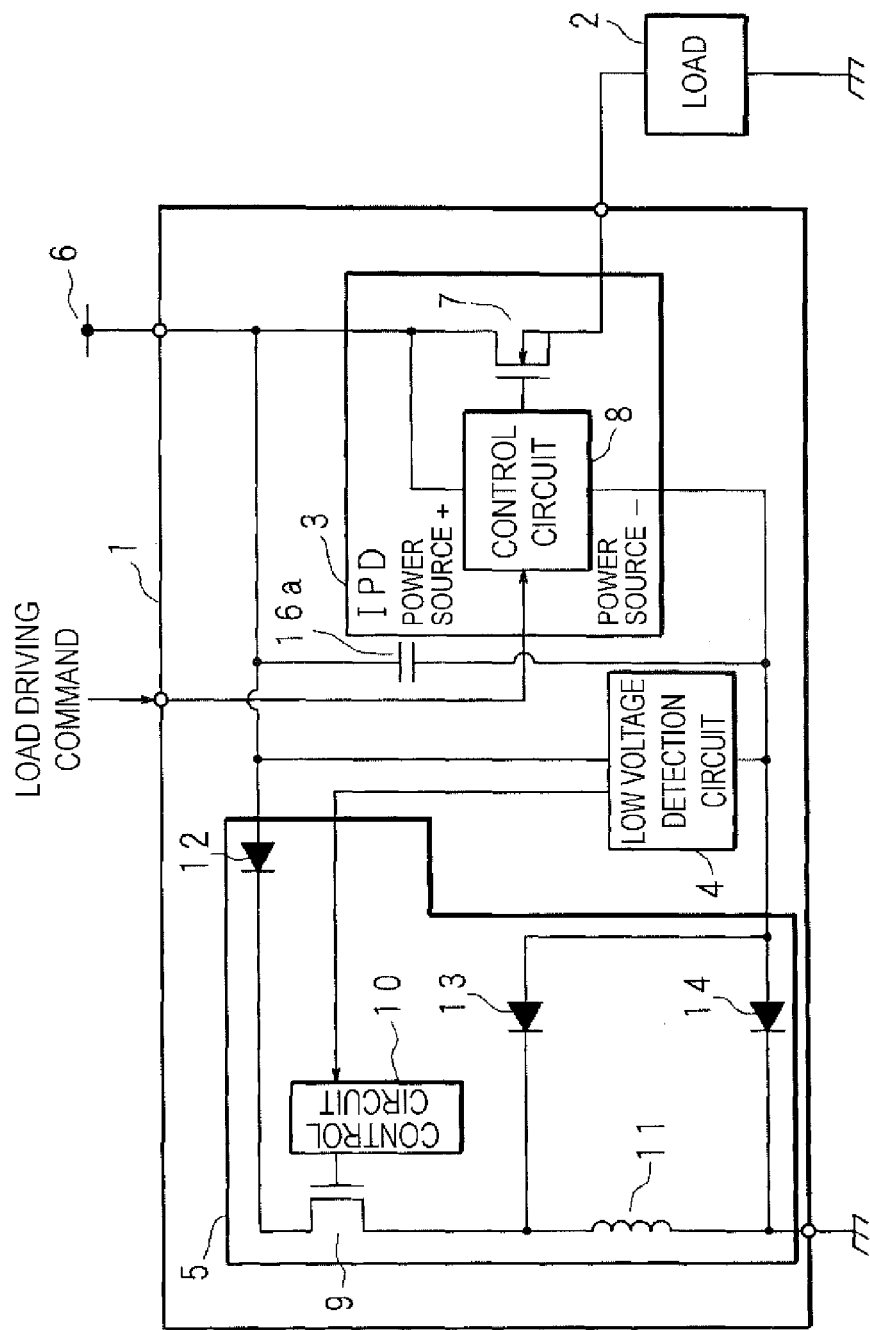
FIG. 1 is a circuit diagram schematically illustrating the configuration of an embodiment of a power-supply control device according to the present disclosure.

FIG. 1 is a circuit diagram schematically illustrating the configuration of Embodiment 1 of a power-supply control device according to the present disclosure.

A power-supply control device 1 in this diagram is installed in a vehicle and includes an N-channel MOSFET (metal oxide field-effect transistor) 7 that is interposed between a direct-current power source 6 and a load 2 as well as a control circuit 8 to which a voltage is applied from the power source 6, the voltage being applied across a high-voltage side input terminal and a low-voltage side input terminal of the control circuit 8, and which turns the FET 7 on or off based in an operating signal for the load 2 that is applied from an external device.

The FET 7 and the control circuit 8 constitute an IPD (semiconductor relay) 3 with self-protection functionality.

The power-supply control device 1 also includes a low voltage detection circuit (voltage detector) 4 that detects the value of the voltage applied to the control circuit 8 by the power source 6 and determines whether or not the detected applied voltage value is lower than a predetermined voltage value and a negative voltage output circuit 5 that outputs a negative voltage to the low-voltage side input terminal of the control circuit 8 if the low voltage detection circuit 4 determines that the applied voltage value is lower than the predetermined voltage value.

The negative voltage output circuit 5 includes a diode (first diode) 12 whose anode is connected to the power source 6, a switching element (transistor) 9 that is connected to the cathode of the diode 12 at one terminal, and a coil 11 that is connected between the other terminal of the switching element 9 and a ground terminal (fixed potential terminal).

The negative voltage output circuit 5 also includes a diode (third diode) 13 whose cathode is connected to a terminal of the coil 11 on the switching element 9 side and whose anode is connected to the low-voltage side input terminal of the control circuit 8, a diode (second diode) 14 whose cathode is connected to a ground-side terminal of the coil 11 and whose anode is connected to the low-voltage side input terminal of the control circuit 8, and a control circuit (second control circuit) 10 that performs on/off control (switching) of the switching element 9 if the low voltage detection circuit 4 determines that the value of the voltage applied to the control circuit 8 is lower than the predetermined voltage value.

The control circuit 8 has a smoothing capacitor 16a that is connected between the high-voltage side input terminal and the low-voltage side input terminal of the control circuit 8 and that smoothes the power source voltage applied to the control circuit 8.

In the power-supply control device 1 having the above-described configuration, the control circuit 8 turns on the FET 7, thereby driving the load 2, when the control circuit 8 receives a load driving command signal from an external device such as a vehicle's body ECU (Electronic Control Unit), which is not shown, and the control circuit 8 turns off the FET 7, thereby stopping the load 2, when the control circuit 8 receives no load driving command signal.

The low voltage detection circuit 4 detects the value of the voltage of the power source 6 that is applied to the control circuit 8 and determines whether or not the detected voltage value is lower than a predetermined voltage value at which the control circuit 8 is operable. The low voltage detection circuit 4 outputs no step-down operation command signal to the control circuit 10 so as not to operate the negative voltage output circuit 5, if the detected voltage value is not lower than the predetermined voltage value.

The low voltage detection circuit 4 outputs a step-down operation command signal to the control circuit 10 so as to operate the negative voltage output circuit 5, if the detected voltage value is lower than the predetermined voltage value.

When a step-down operation command signal from the low voltage detection circuit 4 is applied to the control circuit 10, the control circuit 10 performs on/off control (switching) of the switching element 9. The current flowing through the coil 11 is intermittently stopped by turning on/off the switching element 9.

When the switching element 9 is turned on, thereby allowing a current to flow through the coil 11, the voltage at the terminal of the coil 11 on the switching element 9 side is positive, but the diode 13 prevents this positive voltage from being applied to the low-voltage side input terminal of the control circuit 8.

When the switching element 9 is turned off, thereby interrupting the current, the current continues flowing through the coil 11 by an inertial force. Accordingly, positive electric charges are drawn from among the coil 11, the switching element 9, and the diode 13, and thus a negative voltage is produced. This negative voltage is applied to the low-voltage side input terminal of the control circuit 8 via the diode 13. As a result, the voltage that is applied across the high-voltage side input terminal and the low-voltage side input terminal of the control circuit 8 increases, and the control circuit 8 operates.

The above-described circuit operations are repeated by intermittently stopping the current flowing through the coil 11, and thus the low-voltage side input terminal of the control circuit 8 is maintained at negative voltage. The smoothing capacitor 16a smoothes this negative voltage, thereby maintaining the negative voltage more stable.

It should be noted that a configuration may also be adopted in which the control circuit 10 performs on/off control of the switching element 9 while setting a duty ratio in accordance with the voltage value detected by the low voltage detection circuit 4.

Embodiment 2

Figure 2:
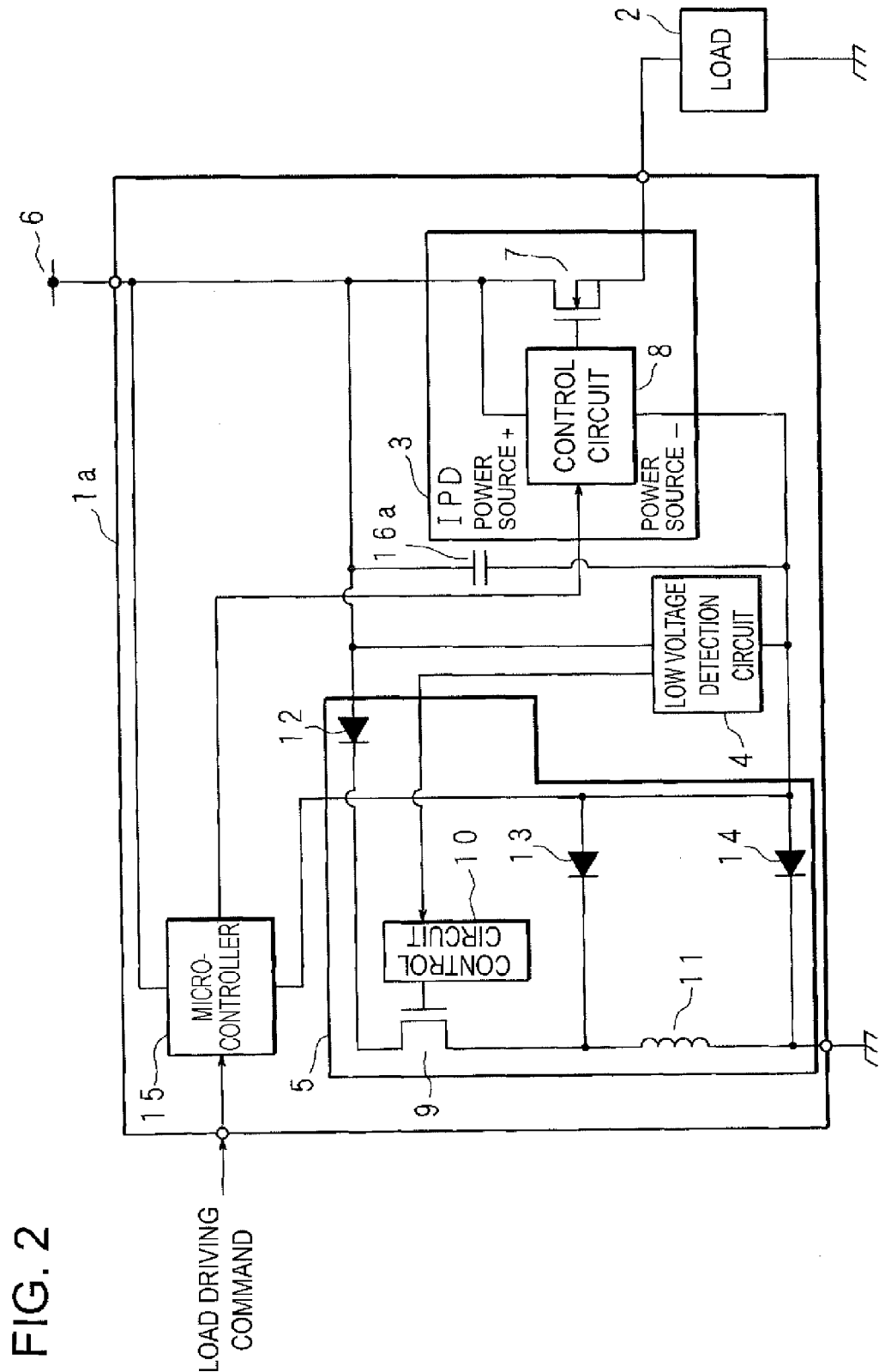
FIG. 2 is a circuit diagram schematically illustrating the configuration of an embodiment of the power-supply control device according to the present disclosure.

FIG. 2 is a circuit diagram schematically illustrating the configuration of Embodiment 2 of a power-supply control device according to the present disclosure.

A power-supply control device 1a in this diagram includes a microcontroller (hereinafter referred to as "microcontroller") 15 to which a load driving command signal is applied from an external device such as a vehicle's body ECU, which is not shown. The microcontroller 15 is connected between the power source 6 and the low-voltage side input terminal of the control circuit 8, and the power source voltage is supplied to the microcontroller 15. The microcontroller 15 relays the load driving command signal applied from the external device to the control circuit 8. Otherwise, the configuration and operations are the same as those described in Embodiment 1, and thus their description is omitted.

Embodiment 3

Figure 3:
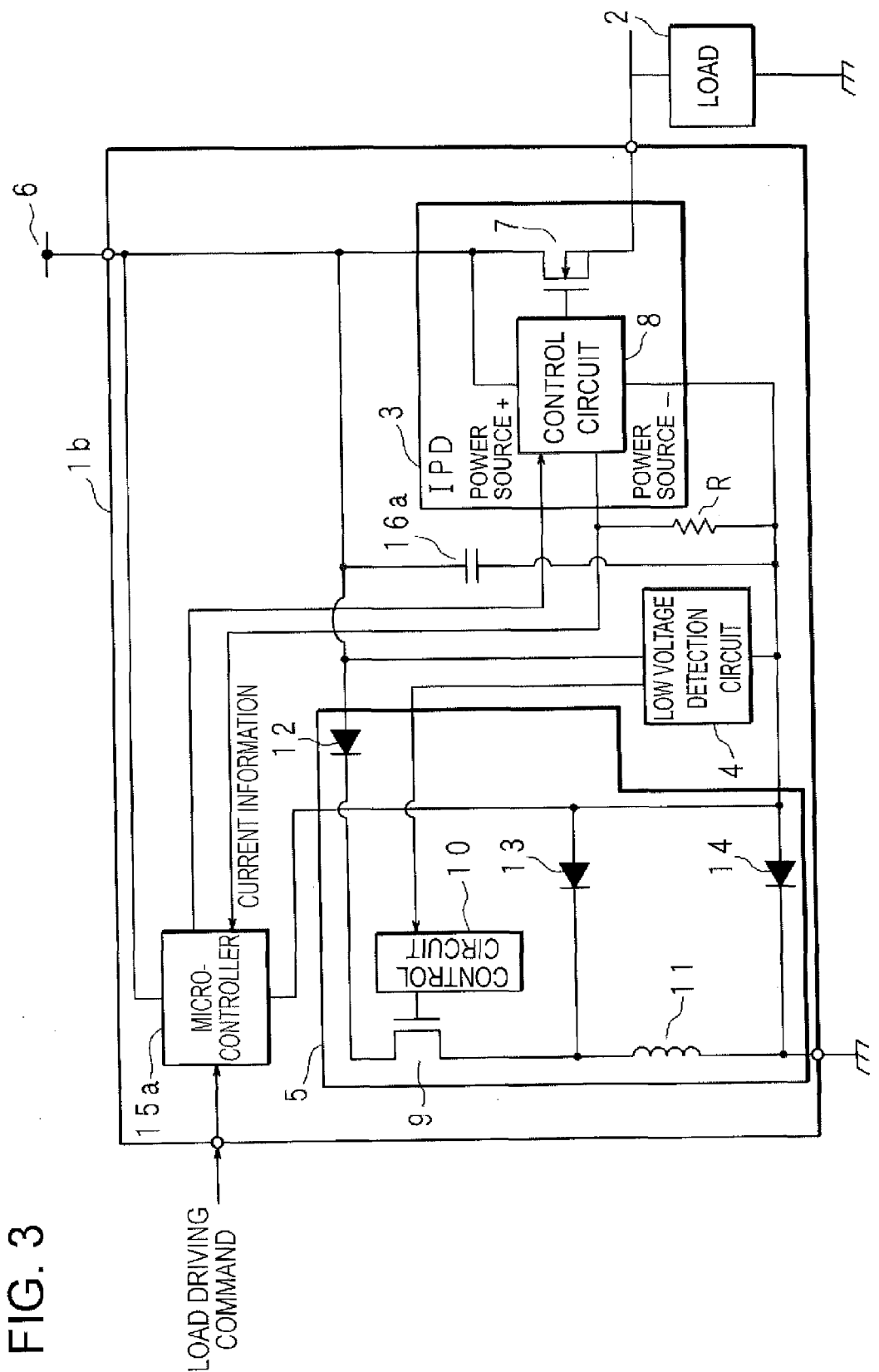
FIG. 3 is a circuit diagram schematically illustrating the configuration of an embodiment of the power-supply control device according to the present disclosure.

FIG. 3 is a circuit diagram schematically illustrating the configuration of Embodiment 3 of a power-supply control device according to the present disclosure.

A power-supply control device 1b in this diagram includes a microcontroller (hereinafter referred to as "microcontroller") 15a to which a load driving command signal is applied from an external device such as a vehicle's body ECU, which is not shown. The microcontroller 15a is connected between the power source 6 and the low-voltage side input terminal of the control circuit 8, and the power source voltage is supplied to the microcontroller 15a. The microcontroller 15a relays the load driving command signal applied from the external device to the control circuit 8.

In addition, a current value of the FET 7 is applied to the microcontroller 15a by a shunt resistor R whose low-voltage side is connected to the low-voltage side input terminal of the control circuit 8. The microcontroller 15a monitors this current value, and is capable of A/D (analog/digital) conversion of the current value of the FET 7 using the same negative voltage (ground) as that of the low-voltage side input terminal of the control circuit 8 as the reference. Thus, even when the output voltage of the power source 6 is low, whether the power supplied to the load 2 should be supplied or interrupted can be determined based on the current value of the FET 7. Otherwise, the configuration and operations are the same as those described in Embodiment 1, and thus their description is omitted.

Embodiment 4

Figure 4:
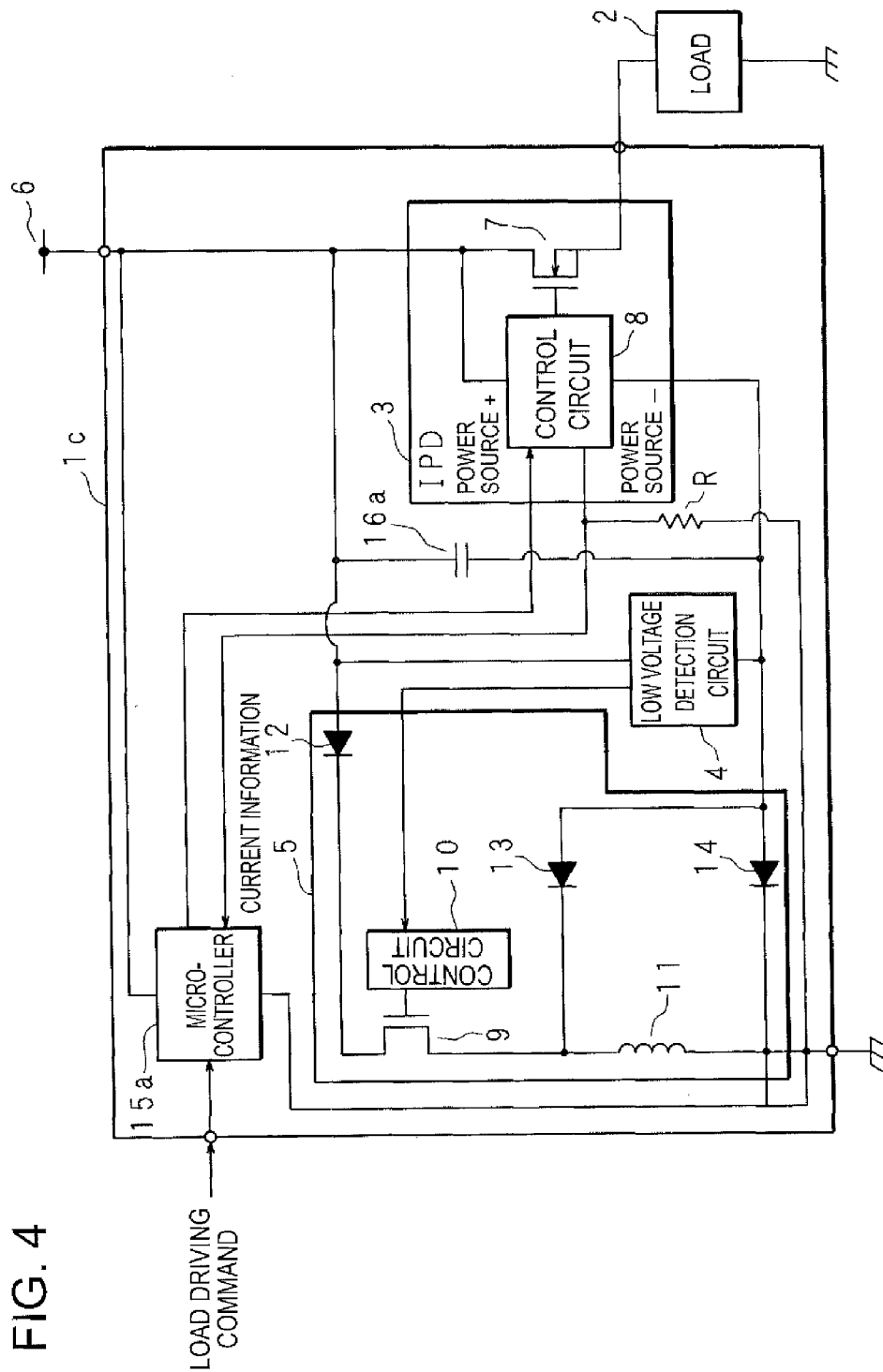
FIG. 4 is a circuit diagram schematically illustrating the configuration of an embodiment of the power-supply control device according to the present disclosure.

FIG. 4 is a circuit diagram schematically illustrating the configuration of Embodiment 4 of a power-supply control device according to the present disclosure.

In a power-supply control device 1c in this diagram, the microcontroller 15a is connected between the power source 6 and the ground terminal, and the power source voltage is supplied to the microcontroller 15a. The microcontroller 15a relays a load driving command signal applied from an external device to the control circuit 8.

In addition, a current value of the FET 7 is applied to the microcontroller 15a by the shunt resistor R whose low-voltage side is connected to the ground terminal. The microcontroller 15a monitors this current value, and is capable of A/D (analog/digital) conversion of the current value of the FET 7 using the ground voltage as the reference. Thus, even when the output voltage of the power source 6 is low, whether the power supplied to the load 2 should be supplied or interrupted can be determined based on the current value of the FET 7. Otherwise, the configuration and operations are the same as those described in Embodiment 3, and thus their description is omitted.

Embodiment 5

Figure 5:
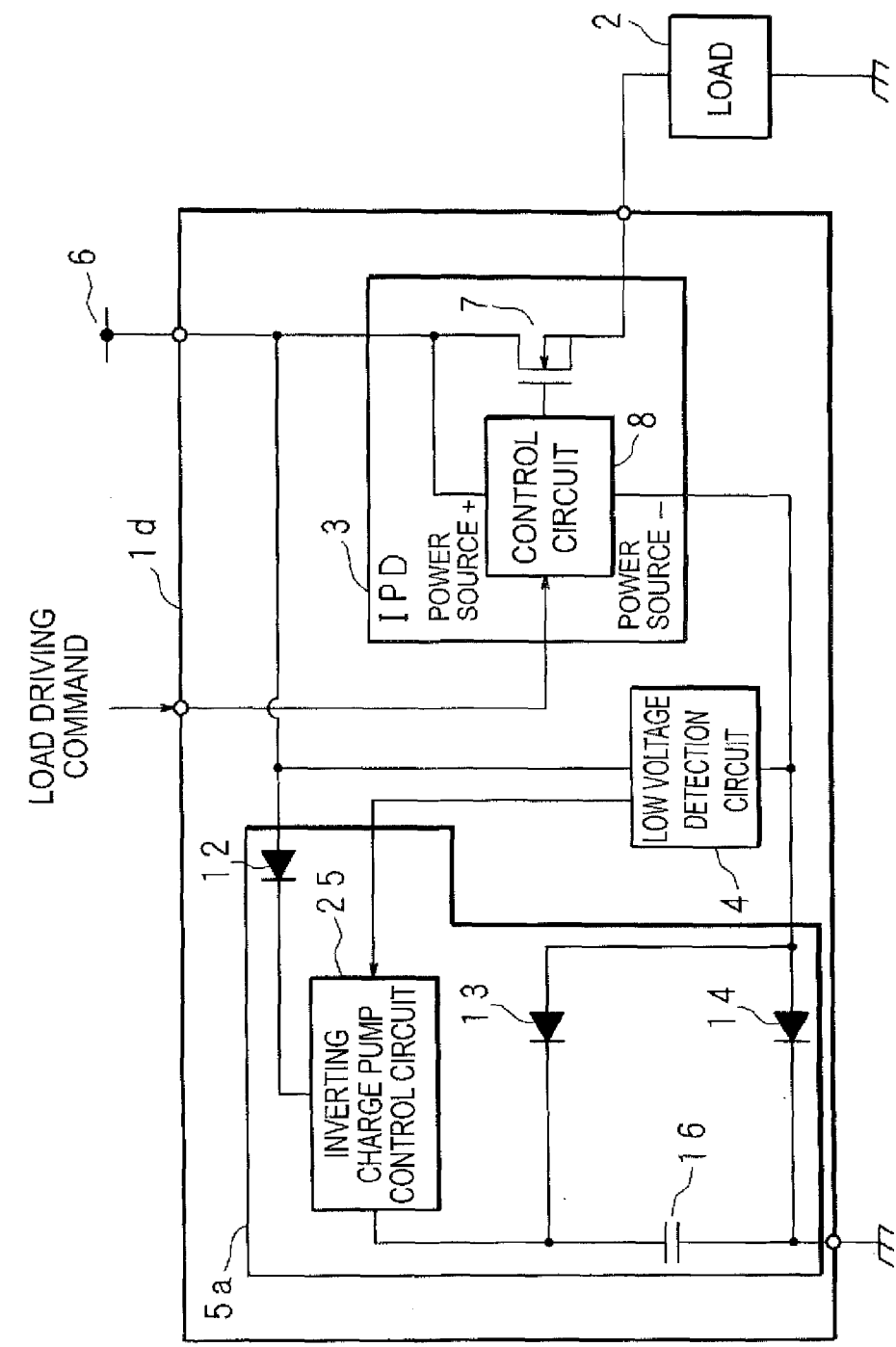
FIG. 5 is a circuit diagram schematically illustrating the configuration of an embodiment of the power-supply control device according to the present disclosure.

FIG. 5 is a circuit diagram schematically illustrating Embodiment 5 of a power-supply control device according to the present disclosure.

A power-supply control device 1d in this diagram includes a negative voltage output circuit 5a that outputs a negative voltage to the low-voltage side input terminal of the control circuit 8 if the low voltage detection circuit 4 determines that the applied voltage value is lower than the predetermined voltage value.

The negative voltage output circuit 5a includes the diode (first diode) 12 whose anode is connected to the power source 6, an inverting charge pump control circuit 15 which is connected to the cathode of the diode 12 and to which the power source voltage is applied, and a capacitor 16 that is connected between an output terminal of the inverting charge pump control circuit 25 and the ground terminal (fixed potential terminal). The inverting charge pump control circuit 25 and the capacitor 16 constitute an inverting charge pump circuit.

The negative voltage output circuit 5a also includes the diode (third diode) 13 whose cathode is connected to a terminal of the capacitor 16 on the inverting charge pump control circuit 25 side and whose anode is connected to the low-voltage side input terminal of the control circuit 8 as well as the diode (second diode) 14 whose cathode is connected to a ground-side terminal of the capacitor 16 and whose anode is connected to the low-voltage side input terminal of the control circuit 8.

If the low voltage detection circuit 4 determines that the value of the voltage applied to the control circuit 8 is lower than the predetermined voltage value, the inverting charge pump control circuit 25 is operated, and a negative voltage is output from the capacitor 16 to the low-voltage side input terminal of the control circuit 8.

It should be noted that if the inverting charge pump circuit is configured by providing the inverting charge pump control circuit 25 in the negative voltage output circuit 5a as in Embodiment 5, it is also possible not to include the diode 13 and short the circuit instead.

Figure 6:
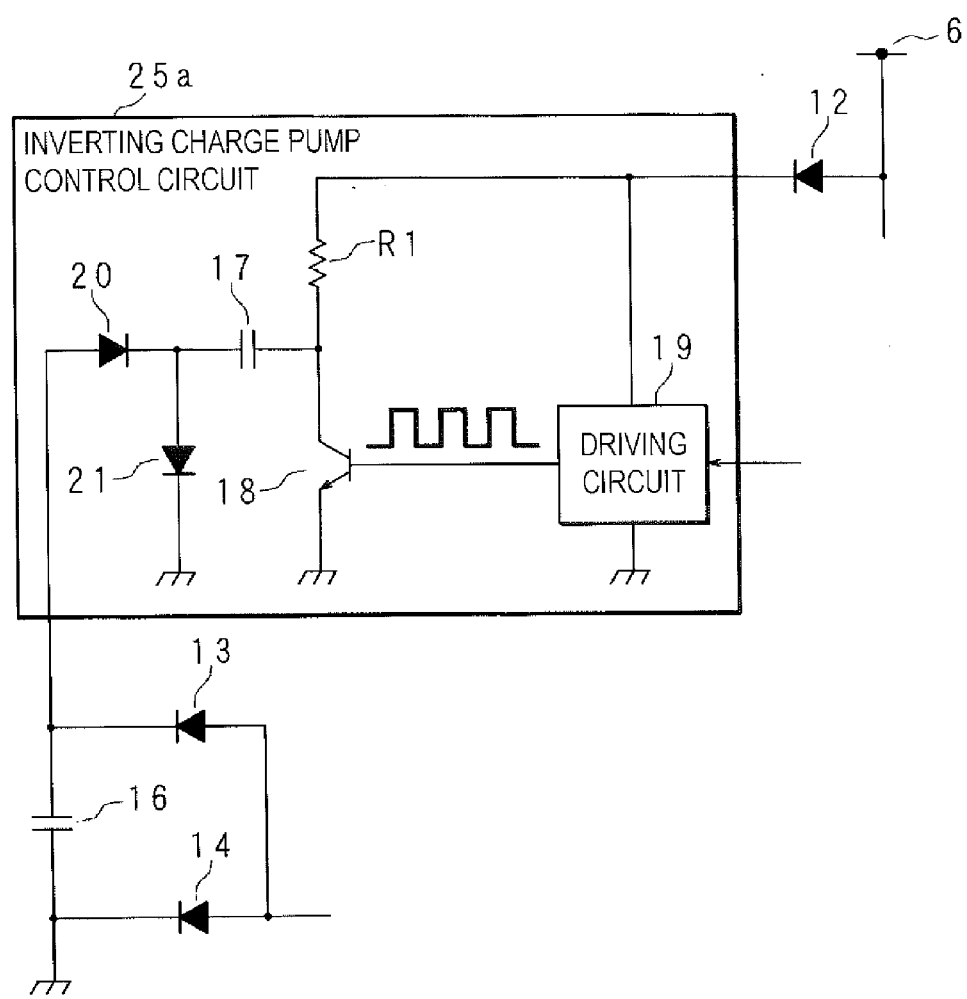
FIG. 6 is a circuit diagram illustrating a specific configuration example of an inverting charge pump control circuit.

FIG. 6 is a circuit diagram illustrating a specific configuration example of the inverting charge pump control circuit 25.

An inverting charge pump control circuit 25a includes a driving circuit 19 which is connected between the cathode of the diode 12 and a ground terminal, to which the power source voltage is applied, and which outputs a periodic rectangular wave voltage if the low voltage detection circuit 4 determines that the value of the voltage applied to the control circuit 8 is lower than the predetermined voltage value, as well as an NPN transistor 18 whose base receives the rectangular wave voltage from the driving circuit 19, whose collector is connected to the cathode of the diode 12 via a resistor R1, and whose emitter is grounded.

The inverting charge pump control circuit 25a also includes a capacitor 17 that is connected to the collector of the transistor 18 at one terminal, a diode 20 whose cathode is connected to the other terminal of the capacitor 17 and whose anode is connected to the cathode of the diode 13 (the terminal of the capacitor 16 on the inverting charge pump control circuit 25a side), and a diode 21 whose anode is connected to the other terminal of the capacitor 17 and whose cathode is grounded.

In the negative voltage output circuit 5a including the inverting charge pump control circuit 25a that has the above-described configuration, the transistor 18 is turned on and off by the driving circuit 19 operating and outputting a periodical rectangular wave voltage.

When the transistor 18 is turned off, the capacitor 17 is charged along a path through the resistor R1, the capacitor 17, and the diode 21.

Then, when the transistor 18 is turned on, the terminal of the capacitor 17 on the transistor 18 side is grounded, and thus the voltage at the terminal of the capacitor 17 on the side of the diodes 20 and 21 is negative. This negative voltage is applied to the low-voltage side input terminal of the control circuit 8 via the diodes 20 and 13, and also charges the capacitor 16 (the ground terminal side thereof is positive) along a path through the ground terminal, the capacitor 16, and the diode 20 (the capacitor 17 discharges).

Then, when the transistor 18 is turned off, the capacitor 17 is charged along the path through the resistor R1, the capacitor 17, and the diode 21. Meanwhile, the capacitor 16 applies a negative voltage to the low-voltage side input terminal of the control circuit 8 via the diode 13.

Then, when the transistor 18 is turned on, the terminal of the capacitor 17 on the transistor 18 side is grounded, and the voltage at the terminal of the capacitor 17 on the side of the diodes 20 and 21 is negative.

This negative voltage of the capacitor 17 is applied to the low-voltage side input terminal of the control circuit 8 via the diodes 20 and 13, and also charges the capacitor 16 (the ground terminal side thereof is positive) along the path through the ground terminal, the capacitor 16, and the diode 20 (the capacitor 17 discharges).

The above-described operations are repeated, and thus negative voltage is stably applied to the low-voltage side input terminal of the control circuit 8.

Figure 7:
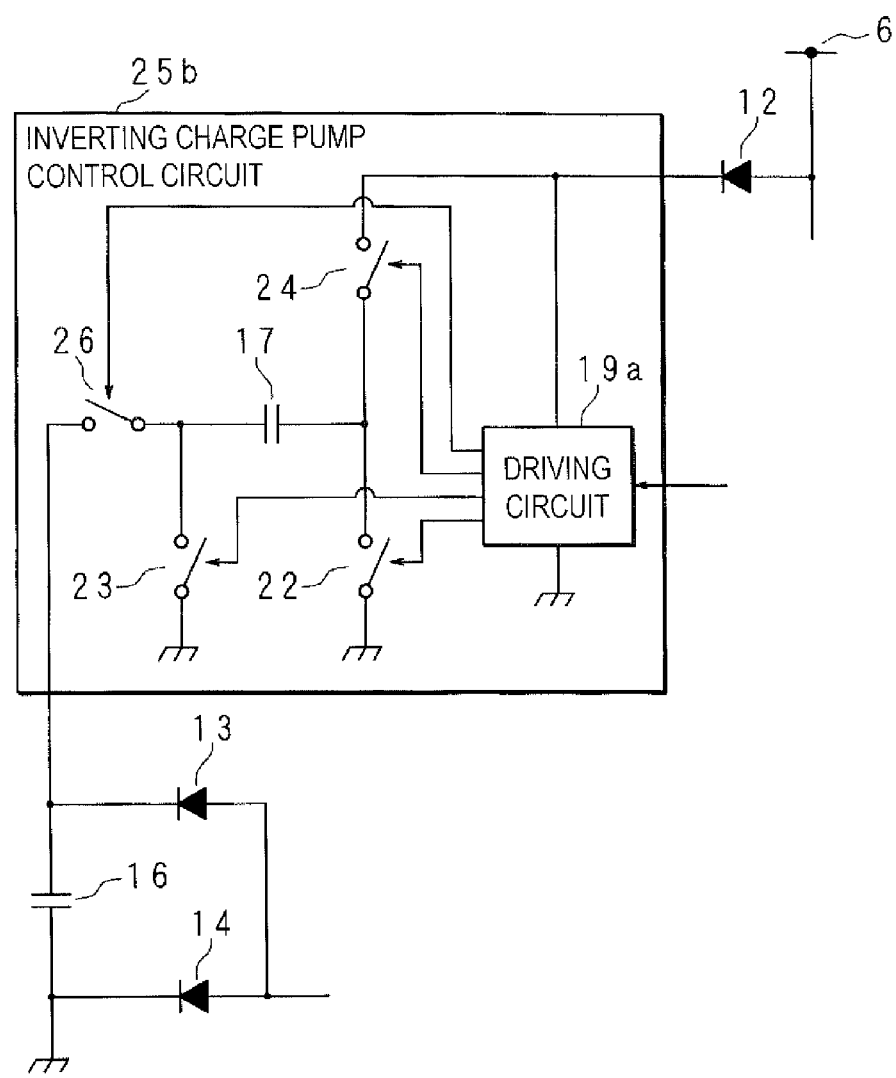
FIG. 7 is a circuit diagram illustrating another specific configuration example of the inverting charge pump control circuit.

FIG. 7 is a circuit diagram illustrating another specific configuration example of the inverting charge pump control circuit 25.

An inverting charge pump control circuit 25b in this diagram includes a driving circuit 19a which is connected between the cathode of the diode 12 and a ground terminal, to which the power source voltage is applied, and which is operated if the low voltage detection circuit 4 determines that the value of the voltage applied to the control circuit 8 is lower than the predetermined voltage value, switches 22, 23, 24, and 26 that are individually turned on or off by the driving circuit 19a, and the capacitor 17.

One terminal of the switch 24 is connected to the cathode of the diode 12, and the other terminal of the switch 24 is connected to one terminal of the capacitor 17 and one terminal of the switch 22. The other terminal of the switch 22 is grounded.

The other terminal of the capacitor 17 is connected to one terminal of each of the switches 23 and 26. The other terminal of the switch 26 is connected to the cathode of the diode 13 (the terminal of the capacitor 16 on the inverting charge pump control circuit 25b side), and the other terminal of the switch 23 is grounded.

In the negative voltage output circuit 5a including the inverting charge pump control circuit 25b that has the above-described configuration, when the driving circuit 19a is operated, first, the driving circuit 19a turns on the switches 23 and 24 and turns off the switches 22 and 26. Thus, the capacitor 17 is charged along a path through the switch 24, the capacitor 17, and the switch 23.

Then, the driving circuit 19a turns off the switches 23 and 24 and turns on the switches 22 and 26. This causes the terminal of the capacitor 17 on the switch 22 side to be grounded, and thus, the voltage at the terminal of the capacitor 17 on the switch 23 side is negative. This negative voltage is applied to the low-voltage side input terminal of the control circuit 8 via the switch 26 and the diode 13, and also charges the capacitor 16 (the ground terminal side thereof is positive) along a path through the ground terminal, the capacitor 16, and the switch 26 (the capacitor 17 discharges).

Then, the driving circuit 19a turns on the switches 23 and 24 and turns off the switches 22 and 26. Thus, the capacitor 17 is charged along the path through the switch 24, the capacitor 17, and the switch 23. Meanwhile, the capacitor 16 applies a negative voltage to the low-voltage side input terminal of the control circuit 8 via the diode 13.

Then, the driving circuit 19a turns off the switches 23 and 24 and turns on the switches 22 and 26. This causes the terminal of the capacitor 17 on the switch 22 side to be grounded, and thus, the voltage at the terminal of the capacitor 17 on the switch 23 side is negative. This negative voltage is applied to the low-voltage side input terminal of the control circuit 8 via the diode 13 and the switch 26, and also charges the capacitor 16 (the ground terminal side thereof is positive) along the path through the ground terminal, the capacitor 16, and the switch 26 (the capacitor 17 discharges).

The above-described operations are repeated, and thus negative voltage is stably applied to the low-voltage side input terminal of the control circuit 8.

In the power-supply control device 1d (FIG. 5) having the above-described configuration, the control circuit 8 turns on the FET 7, thereby driving the load 2, when the control circuit 8 receives a load driving command signal from an external device such as a vehicle's body ECU (Electronic Control Unit), which is not shown, and the control circuit 8 turns off the FET 7, thereby stopping the load 2, when the control circuit 8 receives no load driving command signal.

The low voltage detection circuit 4 detects the value of the voltage of the power source 6 applied to the control circuit 8, and determines whether or not the detected voltage value is lower than a predetermined voltage value at which the control circuit 8 is operable. If the detected voltage value is not lower than the predetermined voltage value, the low voltage detection circuit 4 does not output a step-down operation command signal to the inverting charge pump control circuit 25 so as not to operate the negative voltage output circuit 5a.

If the detected voltage value is lower than the predetermined voltage value, the low voltage detection circuit 4 outputs a step-down operation command signal to the inverting charge pump control circuit 25 so as to operate the negative voltage output circuit 5a. The operation of the negative voltage output circuit 5a was described in conjunction with the operation of the inverting charge pump control circuit 25a (FIG. 6), and in conjunction with the operation of the inverting charge pump control circuit 25b (FIG. 7), and thus is not described here.

Otherwise, the configuration and operations of the power-supply control device 1d are the same as those of the above-described power-supply control device 1 (FIG. 1), and thus their description is omitted. However, since the capacitor 16 of the power-supply control device 1d also has a smoothing function, the necessity for the smoothing capacitor 16a is eliminated.

Embodiment 6

Figure 8:
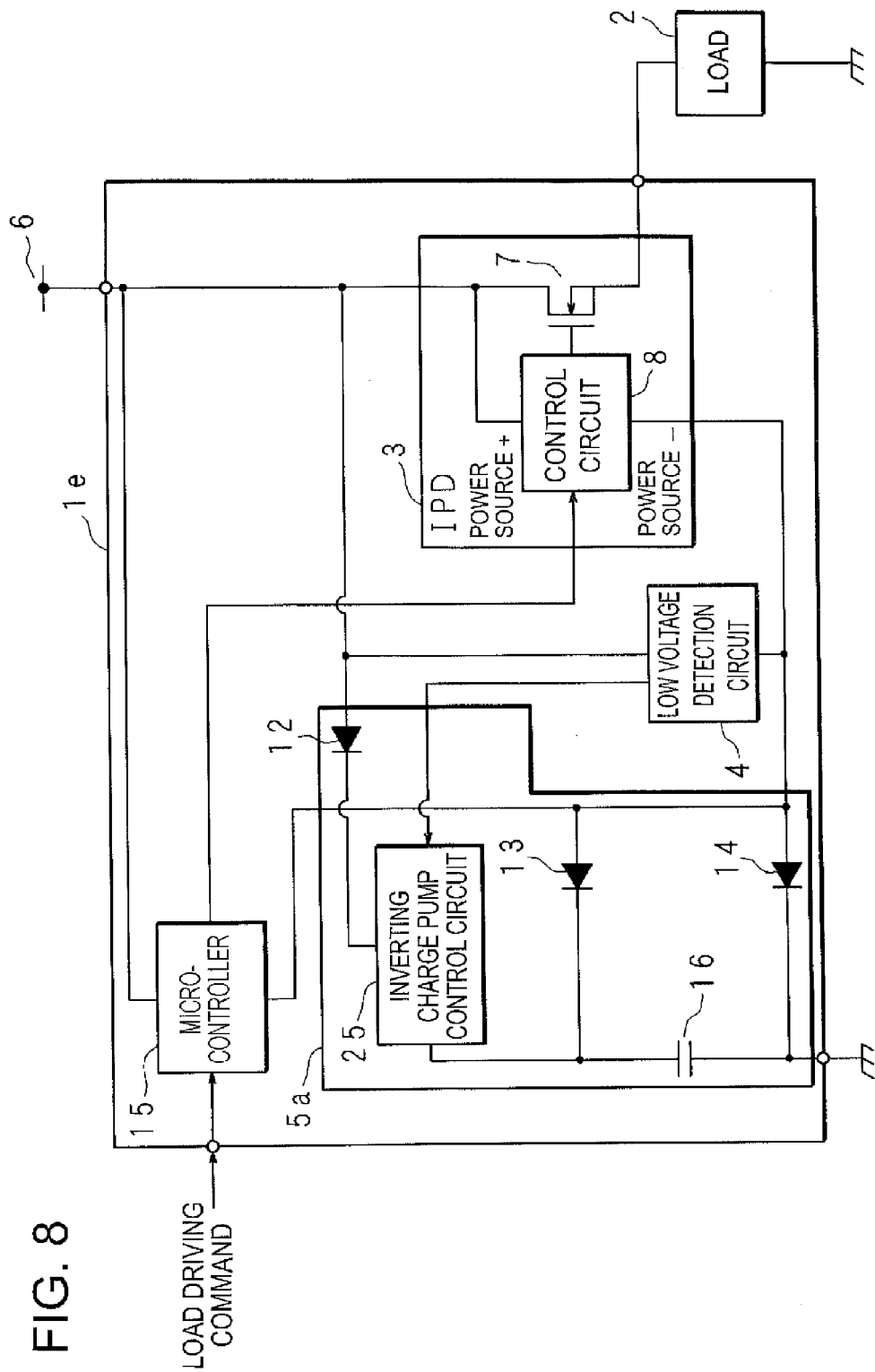
FIG. 8 is a circuit diagram schematically illustrating the configuration of an embodiment of the power-supply control device according to the present disclosure.

FIG. 8 is a circuit diagram schematically illustrating the configuration of Embodiment 6 of a power-supply control device according to the present disclosure.

A power-supply control device 1e in this diagram includes the microcontroller (hereinafter referred to as "microcontroller") 15 to which a load driving command signal is applied from an external device such as a vehicle's body ECU, which is not shown. The microcontroller 15 is connected between the power source 6 and the low-voltage side input terminal of the control circuit 8, and the power source voltage is supplied to the microcontroller 15. The microcontroller 15 relays the load driving command signal applied from the external device to the control circuit 8. Otherwise, the configuration and operations are the same as those of the power-supply control device 1d (FIG. 5) described in Embodiment 5, and thus their description is omitted.

Embodiment 7

Figure 9:
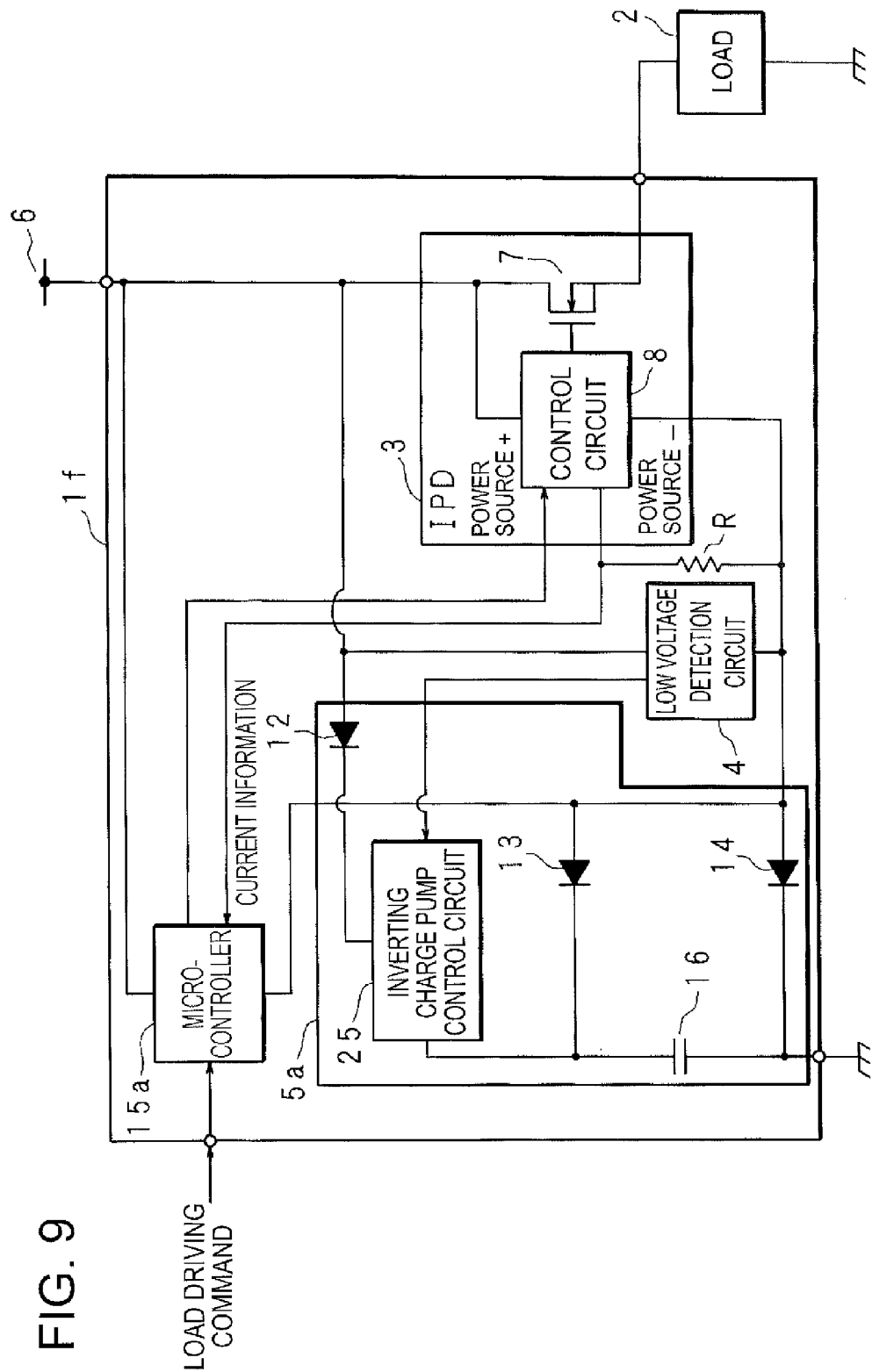
FIG. 9 is a circuit diagram schematically illustrating the configuration of an embodiment of the power-supply control device according to the present disclosure.

FIG. 9 is a circuit diagram schematically illustrating the configuration of Embodiment 7 of a power-supply control device according to the present disclosure.

A power-supply control device if in this diagram includes the microcontroller (hereinafter referred to as "microcontroller") 15a to which a load driving command signal is applied from an external device such as a vehicle's body ECU, which is not shown. The microcontroller 15a is connected between the power source 6 and the low-voltage side input terminal of the control circuit 8, and the power source voltage is supplied to the microcontroller 15a. The microcontroller 15a relays the load driving command signal applied from the external device to the control circuit 8.

In addition, a current value of the FET 7 is applied to the microcontroller 15a by the shunt resistor R whose low-voltage side is connected to the low-voltage side input terminal of the control circuit 8. The microcontroller 15a monitors this current value, and is capable of A/D (analog/digital) conversion of the current value of the FET 7 using the same negative voltage (ground) as that of the low-voltage side input terminal of the control circuit 8 as the reference. Thus, even when the output voltage of the power source 6 is low, whether the power supplied to the load 2 should be supplied or interrupted can be determined based on the current value of the FET 7. Otherwise, the configuration and operations are the same as those of the power-supply control device 1d (FIG. 5) described in Embodiment 5, and thus their description is omitted.

Embodiment 8

Figure 10:
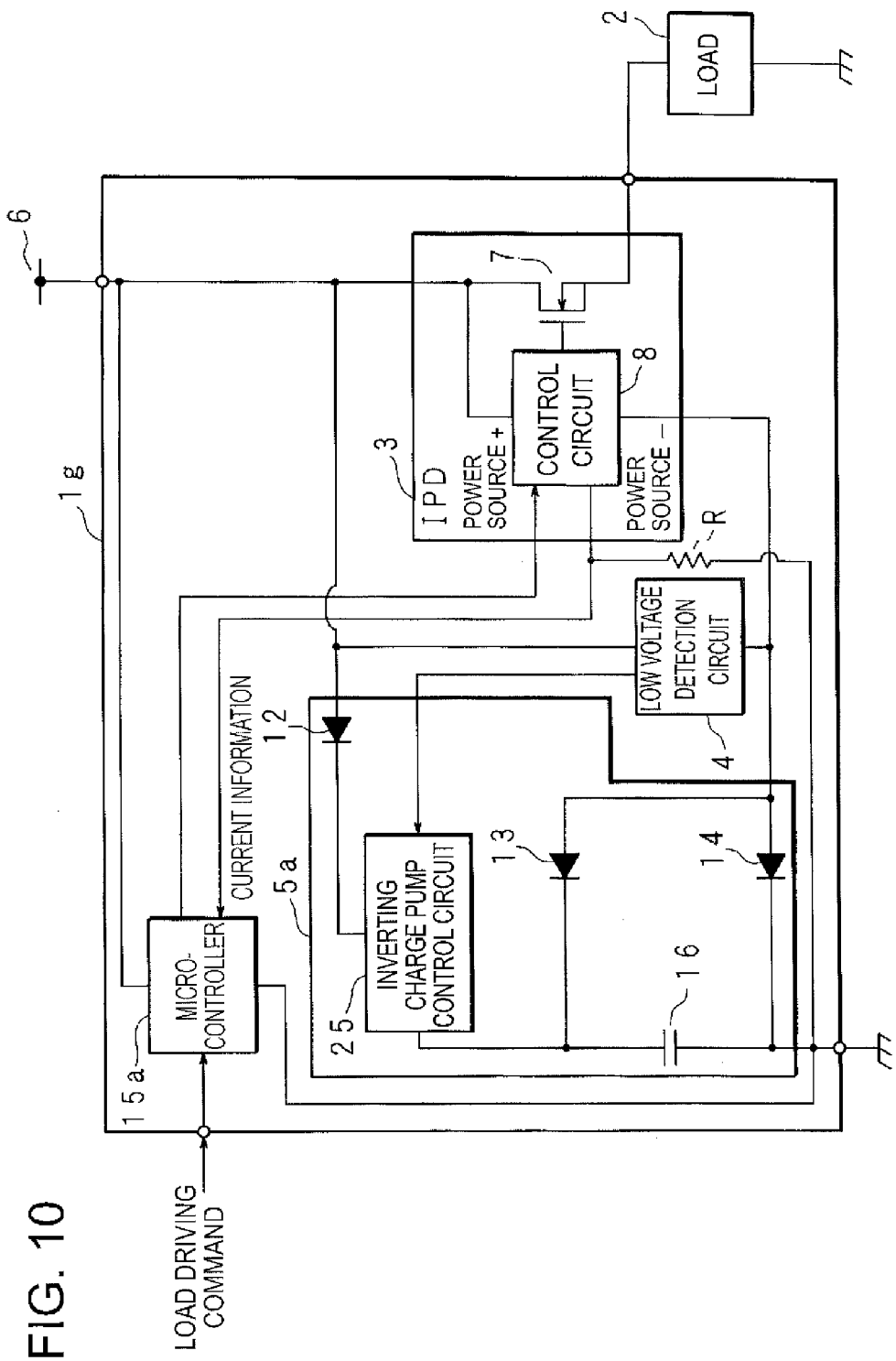
FIG. 10 is a circuit diagram schematically illustrating the configuration of an embodiment of the power-supply control device according to the present disclosure.

FIG. 10 is a circuit diagram schematically illustrating the configuration of Embodiment 8 of a power-supply control device according to the present disclosure.

In a power supply control device 1g in this diagram, the microcontroller 15a is connected between the power source 6 and the ground terminal, and the power source voltage is supplied to the microcontroller 15a. The microcontroller 15a relays a load driving command signal applied from an external device to the control circuit 8.

In addition, a current value of the FET 7 is applied to the microcontroller 15a by the shunt resistor R whose low-voltage side is connected to the ground terminal. The microcontroller 15a monitors this current value, and is capable of A/D (analog/digital) conversion of the current value of the FET 7 using the ground voltage as the reference. Thus, even when the output voltage of the power source 6 is low, whether the power supplied to the load 2 should be supplied or interrupted can be determined based on the current value of the FET 7. Otherwise, the configuration and operations are the same as those of the power-supply control device if (FIG. 9) described in Embodiment 7, and thus their description is omitted.

Embodiment 9

Figure 11:
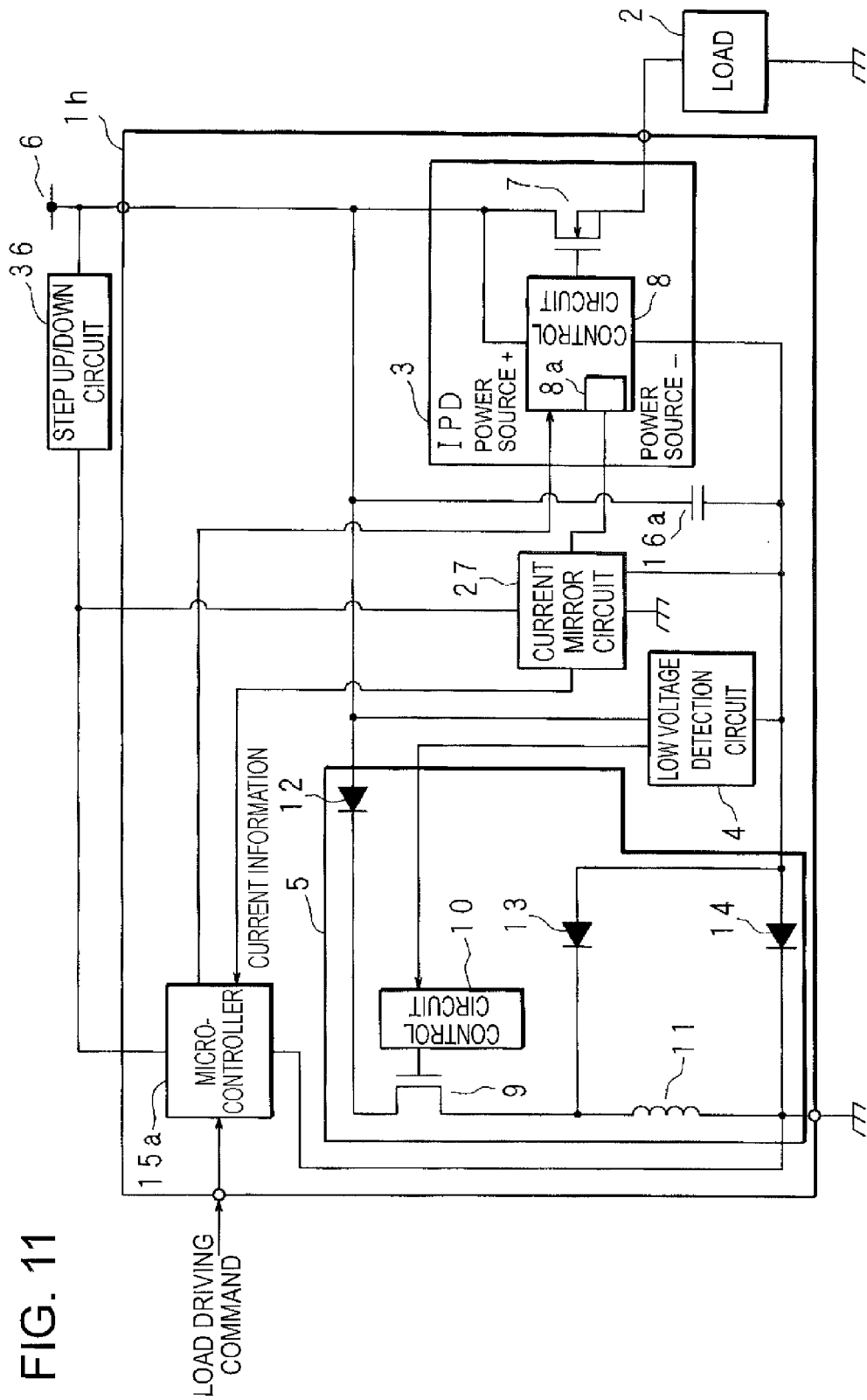
FIG. 11 is a circuit diagram schematically illustrating the configuration of an embodiment of the power-supply control device according to the present disclosure.

FIG. 11 is a circuit diagram schematically illustrating the configuration of Embodiment 9 of a power-supply control device according to the present disclosure.

In the IPD 3, a shunt circuit 8a built into the control circuit 8 diverts a current that is proportional to the current flowing through the FET 7. The current that is diverted by the shunt circuit 8a is passed through a shunt resistor R and converted to a voltage signal, and then applied to the microcontroller 15a, as shown in FIGS. 3, 4, 9, and 10 (the shunt circuit 8a is not shown in these diagrams).

However, in the case where a low-voltage side of the shunt resistor R is connected to the low-voltage side input terminal of the control circuit 8 as shown in FIGS. 3 and 9, there is a problem in that when the output voltage of the power source 6 is low, a potential difference occurs between the low-voltage side input terminal of the control circuit 8 and the ground terminal of the microcontroller 15a, making the voltage signal indicating the current flowing through the FET 7 inaccurate. Moreover, in the case where the low-voltage side of the shunt resistor R is grounded as shown in FIGS. 4 and 10, there is a problem in that although no potential difference occurs between the low-voltage side of the shunt resistor R and the ground terminal of the microcontroller 15a even when the output voltage of the power source 6 is low, the range of the voltage signal indicating the current flowing through the FET 7 becomes equal to or less than the output voltage of the power source 6, making it impossible to accurately detect the current flowing through the FET 7.

To address these problems, a power-supply control device 1h of Embodiment 9 includes a current mirror circuit 27 to which the current that is diverted by the shunt circuit 8a and that is proportional to the current flowing through the FET 7 is input. The current mirror circuit 27 outputs a current that is substantially equal to or proportional to the input current, passes that current through the build-in shunt resistor R (FIGS. 12 to 14) and converts the current to a voltage signal, and then outputs the voltage signal. Similarly to the microcontroller 15a, the low-voltage side of the shunt resistor R is connected to a ground terminal.

The power source of the microcontroller 15a and the current mirror circuit 27 is applied from a step-up/down circuit 36 that outputs a constant voltage by stepping up/down the output voltage of the power source 6. It should be noted that the step-up/down circuit 36 is used for low-power applications such as a control circuit and cannot be used for high-power applications such as the load 2 and the IPD 3 for driving the load 2.

Moreover, the current value of the FET 7 is applied to the microcontroller 15a by the voltage signal output by the current mirror circuit 27. The microcontroller 15a monitors this current value, and is capable of accurate A/D (analog/digital) conversion of the current value of the FET 7 using the ground voltage as the reference.

Therefore, even when the output voltage of the power source 6 is low, whether the power supplied to the load 2 should be supplied or interrupted can be accurately determined based on the current value of the FET 7.

Otherwise, the configuration and operations of Embodiment 9 are the same as the configuration (FIG. 4) and operations described with respect to Embodiment 4, and thus their description is omitted.

Figure 12:
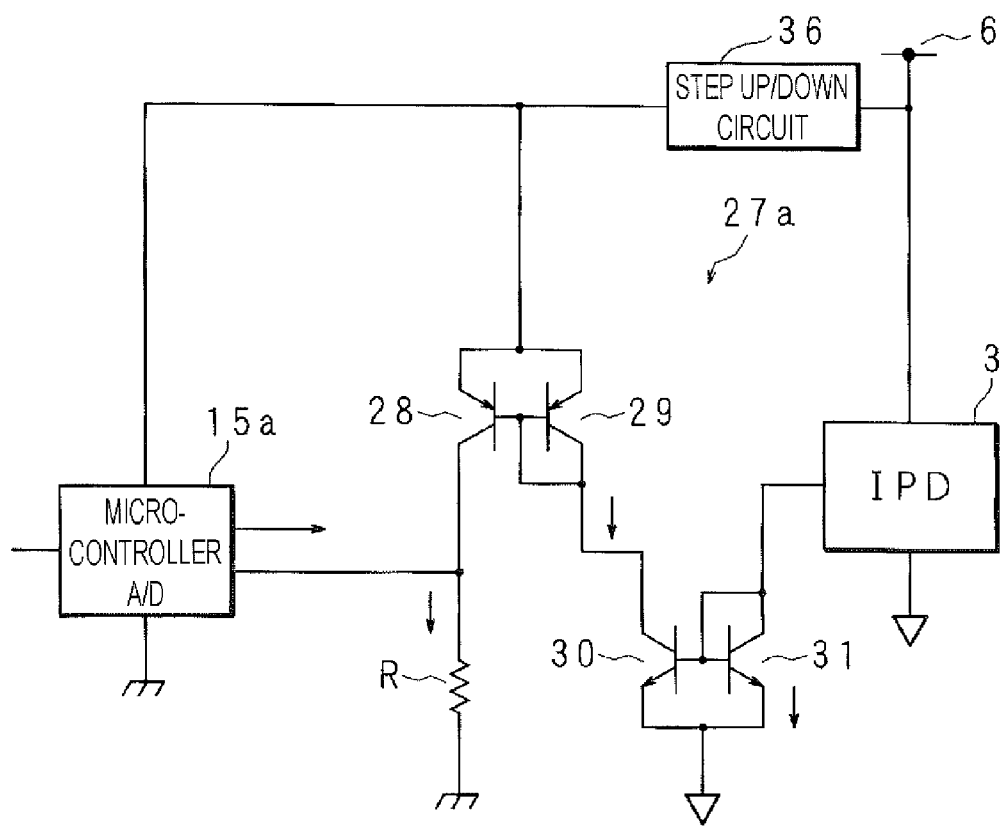
FIG. 12 is a circuit diagram illustrating a specific circuit example of a current mirror circuit.

FIG. 12 is a circuit diagram illustrating a specific circuit example of the current mirror circuit 27.

A current mirror circuit 27a in this diagram duplicates an input current twice using Widlar current mirrors and then outputs the current. The current diverted by the shunt circuit 8a of the IPD 3 is applied to the collector of an NPN transistor 31 as the input current. The emitter of the transistor 31 is connected to the low-voltage side input terminal of the control circuit 8 (IPD 3).

The emitter of a PNP transistor 29 is connected to an output terminal of the step-up/down circuit 36. The collector of the transistor 29 is connected to the collector of an NPN transistor 30. The emitter of the transistor 30 is connected to the low-voltage side input terminal of the control circuit 8 (IPD 3). The bases of the respective transistors 30 and 31 are connected to the collector of the transistor 31.

The emitter of a PNP transistor 28 is connected to the output terminal of the step-up/down circuit 36. The collector of the transistor 28 is connected to the high-voltage side of the shunt resistor R and an A/D conversion input terminal of the microcontroller 15a. The low-voltage side of the shunt resistor R is grounded. The bases of the respective transistors 28 and 29 are connected to the collector of the transistor 29.

In this current mirror circuit 27a, the transistors 30 and 31 have equal characteristics, and thus substantially the same current flows through these two transistors. Also, the transistors 28 and 29 have equal characteristics, and thus substantially the same current flows through these two transistors.

Here, since the emitters of the respective transistors 30 and 31 are connected to the low-voltage side input terminal of the control circuit 8 (IPD 3), even when the output voltage of the power source 6 is low, the range of the diverted current that is proportional to the current flowing through the FET 7 is not reduced, and thus the diverted current flows into the collector of the transistor 31 as is.

A portion of the diverted current flowing into the collector of the transistor 31 serves as a base current of the transistors 30 and 31, and the other portion flows to the low-voltage side input terminal of the control circuit 8 (IPD 3) via the emitter of the transistor 31. Thus, a current that is substantially equal to the diverted current flowing into the collector of the transistor 31 flows to the low-voltage side input terminal of the control circuit 8 (IPD 3) via the collector-emitter path of the transistor 30.

As a result of the current substantially equal to the diverted current flowing through the collector-emitter path of the transistor 30, a current that is substantially equal to the diverted current flows through the emitter-collector path of the transistor 29, and thus a current that is substantially equal to the diverted current also flows to the ground terminal via the emitter-collector path of the transistor 28 and the shunt resistor R.

Consequently, a current that is substantially equal to the diverted current that is proportional to the current flowing through the FET 7 can be allowed to flow to the ground terminal via the shunt resistor R. Therefore, even when the output voltage of the power source 6 is low, the microcontroller 15*a* can correctly detect the value of the current flowing through the FET 7 based on the voltage across the shunt resistor R (or voltage related to that voltage), and can determine whether or not to interrupt the power supplied to the load 2 based on the current value of the FET 7.

Figure 13:
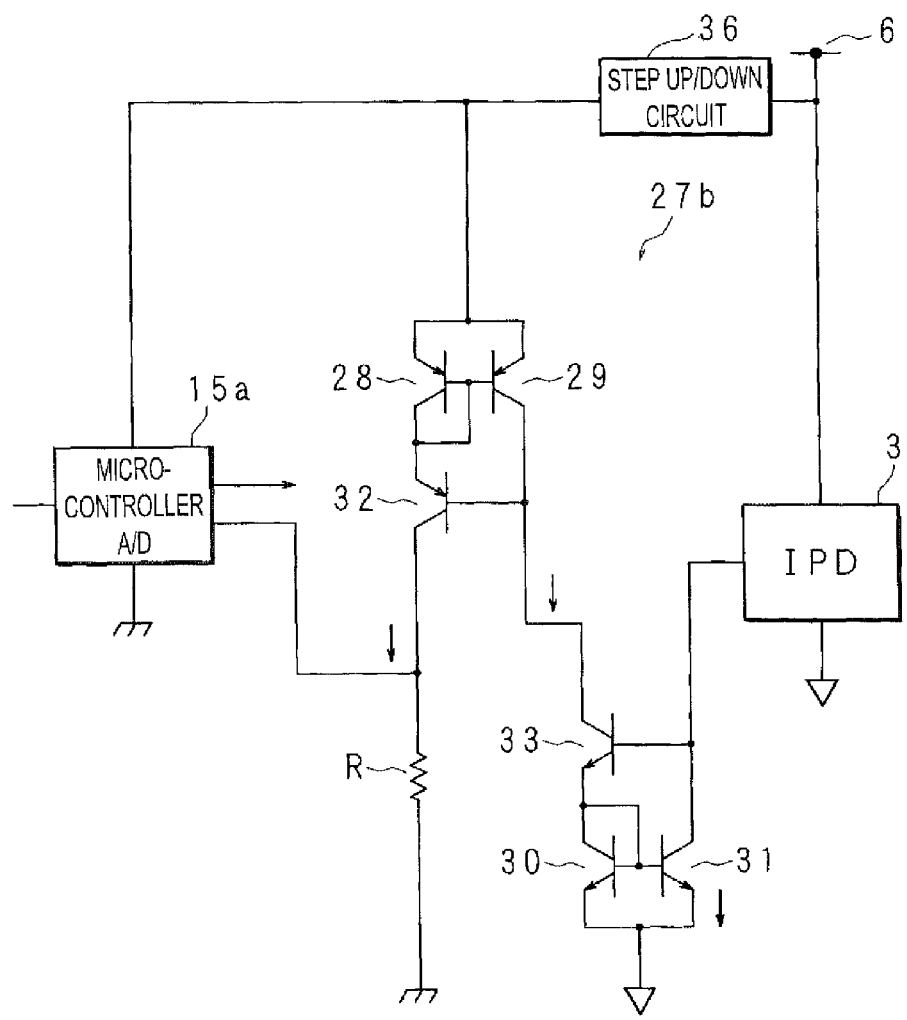
FIG. 13 is a circuit diagram illustrating another specific circuit example of the current mirror circuit.

FIG. 13 is a circuit diagram illustrating another specific circuit example of the current mirror circuit 27.

A current mirror circuit 27*b* in this diagram duplicates an input current twice using Wilson current mirrors and then outputs the current, and thus corrects for an error due to the base current that occurs in the case where Widlar current mirrors are used (FIG. 12).

The collector of the transistor 29 is connected to the collector of an NPN transistor 33. The emitter of the transistor 33 is connected to the collector of the transistor 30 and the bases of the respective transistors 30 and 31. The base of the transistor 33 is connected to the collector of the transistor 31. The transistors 31 and 33 form a negative feedback circuit.

The collector of the transistor 28 is connected to the bases of the respective transistors 28 and 29 and the emitter of a PNP transistor 32. The base of the transistor 32 is connected to the collector of the transistor 29. The transistors 29 and 32 form a negative feedback circuit.

The collector of the transistor 32 is connected to the high-voltage side of the shunt resistor R and the A/D conversion input terminal of the microcontroller 15*a*.

In this current mirror circuit 27*b*, a portion of the diverted current diverted by the control circuit 8 (IPD 3) serves as the base current of the transistor 33 and joins the emitter current of the transistor 33. The emitter current of the transistor 33 is divided into the collector current of the transistor 30 and the base currents of the respective transistors 30 and 31. The base current of the transistor 31 joins the emitter current of the transistor 31, and the base current of the transistor 30 joins the emitter current of the transistor 30.

Consequently, the base current of the transistor 33 that is diverted from the diverted current from the control circuit 8 (IPD 3) returns as the base current of the transistor 31. Thus, when the base currents of the respective transistors 33 and 31 are set to be equal to each other, the diverted current (input current) from the control circuit 8 (IPD 3) and the collector current (output current) of the transistor 33 are equal to each other.

Moreover, the emitter current of the transistor 29 becomes the collector current after the base current is diverted therefrom. The emitter current of the transistor 28 becomes the collector current after the base current is diverted therefrom. The base currents of the respective transistors 28 and 29 join the emitter current of the transistor 32.

The emitter current of the transistor 32 serves as the collector current after the base current is diverted therefrom, and the base current of the transistor 32 joins the collector current of the transistor 29.

Consequently, the base current diverted from the emitter current of the transistor 29 returns to the collector current of the transistor 29 as the base current of the transistor 32. Therefore, when the base currents of the transistors 29 and 32 are set to be equal to each other, the collector current (input current) of the transistor 29 to which the base current of the transistor 32 has joined is equal to the collector current (output current) of the transistor 32.

Here, the collector current (input current) of the transistor 29 to which the base current of the transistor 32 has joined is equal to the collector current (output current) of the transistor 33, and thus the collector current of the transistor 32 is equal to the diverted current diverted by the control circuit 8 (IPD 3). Moreover, the collector current of the transistor 32 flows to the ground terminal via the shunt resistor R.

Thus, a current that is equal to the diverted current that is proportional to the current flowing through the FET 7 can be directed to the ground terminal via the shunt resistor R. Therefore, even when the output voltage of the power source 6 is low, the microcontroller 15*a* can correctly detect the value of the current flowing through the FET 7, and can accurately determine whether or not to interrupt the power supplied to the load 2 based on the current value of the FET 7.

Otherwise, the configuration and operations are the same as those of the above-described current mirror circuit 27*a* (FIG. 12), and thus their description is omitted.

Figure 14:
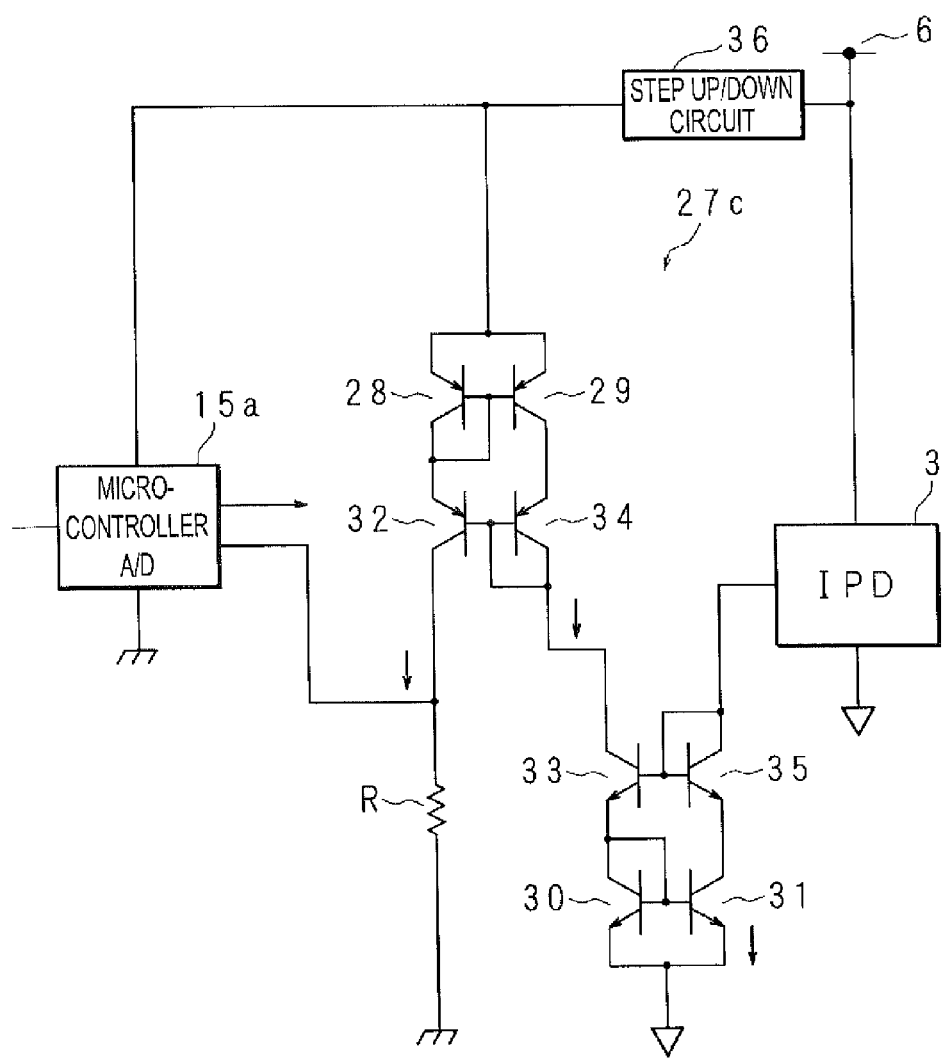
FIG. 14 is a circuit diagram illustrating still another specific circuit example of the current mirror circuit.

FIG. 14 is a circuit diagram illustrating still another schematic circuit example of the current mirror circuit 27.

A current mirror circuit 27*c* in this diagram duplicates an input current twice using high-precision Wilson current mirrors before outputting the current. When compared with the case where Wilson current mirrors are used (FIG. 13), the effect of temperature changes is reduced, and the current can be duplicated with high accuracy.

In the current mirror circuit 27*c*, the current diverted by the shunt circuit 8*a* (FIG. 11) of the IPD 3 is applied to the collector of an NPN transistor 35 as an input current. The emitter of the transistor 35 is connected to the collector of the transistor 31. The collector of the transistor 35 is connected to the bases of the respective transistors 33 and 35.

The collector of the transistor 29 is connected to the emitter of a PNP transistor 34. The collector of the transistor 34 is connected to the bases of the respective transistors 32 and 34 and the collector of the transistor 33.

In this current mirror circuit 27*c*, the diode-connected transistor 35 functions as a voltage adjustment circuit, and serves to equalize the collector-emitter voltages of the respective transistors 30 and 31. Thus, the operating conditions of the transistors 30 and 31 are equalized. It is therefore possible to make the diverted current (input current) from the control circuit 8 (IPD 3) and the collector current (output current) of the transistor 33 equal to each other with higher accuracy.

Moreover, the diode-connected transistor 34 functions as a voltage adjustment circuit, and serves to equalize the emitter-collector voltages of the respective transistor 28 and 29. Thus, the operating conditions of the transistors 28 and 29 are equalized. It is therefore possible to make the collector current (input current) of the transistor 34 and the collector current (output current) of the transistor 32 equal to each other with higher accuracy.

Here, since the collector current (input current) of the transistor 34 is equal to the collector current (output current) of the transistor 33, the collector current of the transistor 32 is equal to the diverted current diverted by the control circuit 8 (IPD 3). Moreover, the collector current of the transistor 32 flows to the ground terminal via the shunt resistor R.

Thus, a current equal to the diverted current that is proportional to the current flowing through the FET 7 can be directed to the ground terminal via the shunt resistor R, and therefore, even when the output voltage of the power source 6 is low, the microcontroller 15a can detect the value of the current flowing through the FET 7 with high accuracy, and can accurately determine whether or not to interrupt the power supplied to the load 2 based on the current value of the FET 7.

Otherwise, the configuration and operations are the same as those of the above-described current mirror circuit 27b (FIG. 13), and thus their description is omitted.

INDUSTRIAL APPLICABILITY

The present disclosure is applicable to a power-supply control device, such as an IPD (Intelligent Power Device), the power-supply control device including a transistor that is interposed between a power source and a load as well as a control circuit that turns the transistor on or off based on an operating signal of the load that is applied from an external device, and controlling supply of power to the load.

The invention claimed is:

1. A power-supply control device, comprising:
    a transistor that is interposed between a power source and a load;
    a control circuit to which a voltage from the power source is applied, the voltage being applied across a high-voltage side input terminal and a low-voltage side input terminal of the control circuit, and that is configured to turn the transistor on or off based on an operating signal for the load that is applied from an external device, and controlling supply of power to the load;
    a voltage detector that is configured to detect a value of the voltage applied to the control circuit by the power source, and is configured to determine whether or not the applied voltage value detected is lower than a predetermined voltage value; and
    a negative voltage output circuit that is configured to output a negative voltage to the low-voltage side input terminal of the control circuit if the voltage detector determines that the applied voltage value is lower than the predetermined voltage value.

2. The power-supply control device according to claim 1, wherein the negative voltage output circuit includes:
    a first diode whose anode is connected to the power source,
    an inverting charge pump circuit which is connected to a cathode of the first diode and to which a power source voltage is applied, and
    a second diode whose cathode is connected to a fixed potential terminal of a capacitor on an output side of the inverting charge pump circuit and whose anode is connected to the low-voltage side input terminal and another terminal of the output-side capacitor,
    the inverting charge pump circuit being configured to operate if the voltage detector determines that the applied voltage value is lower than the predetermined voltage value.

3. The power-supply control device according to claim 1, wherein the negative voltage output circuit includes:
    a first diode whose anode is connected to the power source,
    an inverting charge pump circuit which is connected to a cathode of the first diode and to which a power source voltage is applied, and
    a second diode and a third diode whose cathodes are respectively connected to terminals of a capacitor on an output side of the inverting charge pump circuit and whose anodes are connected to the low-voltage side input terminal,
    the inverting charge pump circuit being configured to operate if the voltage detector determines that the applied voltage value is lower than the predetermined voltage value.

4. The power-supply control device according to claim 1, wherein the negative voltage output circuit includes:
    a first diode whose anode is connected to the power source,
    a switching element that is connected to a cathode of the first diode at one terminal,
    a coil that is connected between another terminal of the switching element and a fixed potential terminal,
    a second diode and a third diode whose cathodes are respectively connected to terminals of the coil and whose anodes are connected to the low-voltage side input terminal, and
    a second control circuit that is configured to perform on/off control of the switching element if the voltage detector determines that the applied voltage value is lower than the predetermined voltage value.

5. The power-supply control device according to claim 1, wherein:
    the control circuit has a shunt circuit that is configured to divert a current that is proportional to a current flowing through the transistor, and
    the power-supply control device further comprises:
       a current mirror circuit to which the current diverted by the shunt circuit is input and which is configured to output a current related to the input current,
       a resistor through which the current output by the current mirror circuit flows, and
       a controller that is configured to determine whether or not to interrupt the current flowing through the transistor based on a voltage related to a voltage across the resistor.

6. The power-supply control device according to claim 2, wherein:
    the control circuit has a shunt circuit that is configured to divert a current that is proportional to a current flowing through the transistor, and
    the power-supply control device further comprises:
       a current mirror circuit to which the current diverted by the shunt circuit is input and which is configured to output a current related to the input current,
       a resistor through which the current output by the current mirror circuit flows, and
       a controller that is configured to determine whether or not to interrupt the current flowing through the transistor based on a voltage related to a voltage across the resistor.

7. The power-supply control device according to claim 3, wherein:
    the control circuit has a shunt circuit that is configured to divert a current that is proportional to a current flowing through the transistor, and the power-supply control device further comprises:
- a current mirror circuit to which the current diverted by the shunt circuit is input and which is configured to output a current related to the input current,
- a resistor through which the current output by the current mirror circuit flows, and
- a controller that is configured to determine whether or not to interrupt the current flowing through the transistor based on a voltage related to a voltage across the resistor.

8. The power-supply control device according to claim 4, wherein:

the control circuit has a shunt circuit that is configured to divert a current that is proportional to a current flowing through the transistor, and the power-supply control device further comprises:
- a current mirror circuit to which the current diverted by the shunt circuit is input and which is configured to output a current related to the input current,
- a resistor through which the current output by the current mirror circuit flows, and
- a controller that is configured to determine whether or not to interrupt the current flowing through the transistor based on a voltage related to a voltage across the resistor.

* * * * *